(12) United States Patent (10) Patent No.: US 6,973,844 B2
Sakai (45) Date of Patent: Dec. 13, 2005

(54) SEMICONDUCTOR MECHANICAL QUANTITY SENSOR

(75) Inventor: Minekazu Sakai, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/791,893

(22) Filed: Mar. 4, 2004

(65) Prior Publication Data

US 2004/0177706 A1  Sep. 16, 2004

(30) Foreign Application Priority Data

Mar. 12, 2003 (JP) .............................. 2003-065836

(51) Int. Cl.[7] .............................................. G01D 7/00
(52) U.S. Cl. ................................................ 73/862.041
(58) Field of Search .......................... 73/862, 862.041, 73/862.046, 862.381, 862.451, 862.626, 73/862.632, 862.637, 862.68

(56) References Cited

U.S. PATENT DOCUMENTS 5,497,668 A * 3/1996 Okada ................... 73/862.626
5,894,091 A * 4/1999 Kubota ................... 73/514.32
6,171,881 B1   1/2001 Fujii ........................... 438/52
6,414,381 B1 * 7/2002 Takeda ....................... 257/676
6,462,530 B1  10/2002 Layton .................... 324/76.49
2002/0011111 A1 * 1/2002 Otsuchi et al. ........... 73/514.34

FOREIGN PATENT DOCUMENTS

JP   A-2000-9470   1/2000

* cited by examiner

*Primary Examiner*—Max Noori
*Assistant Examiner*—Takisha Miller
(74) *Attorney, Agent, or Firm*—Posz Law Group, PLC

(57) ABSTRACT

A semiconductor mechanical quantity sensor includes two sensor chips (100a, 100b) having the same structure and the same characteristics formed on semiconductor substrates (10a, 10b), arranged on a circuit chip (6) in the same direction. There may be used a sensor chip having two sensors of the same structure formed in one semiconductor substrate in the same direction. The number of the sensors may be three or more. A plurality of sensors may be stacked on the semiconductor substrate or on the circuit chip, or may be arranged on both surfaces of the semiconductor substrate (10a, 10b) or the circuit chip (6).

17 Claims, 7 Drawing Sheets

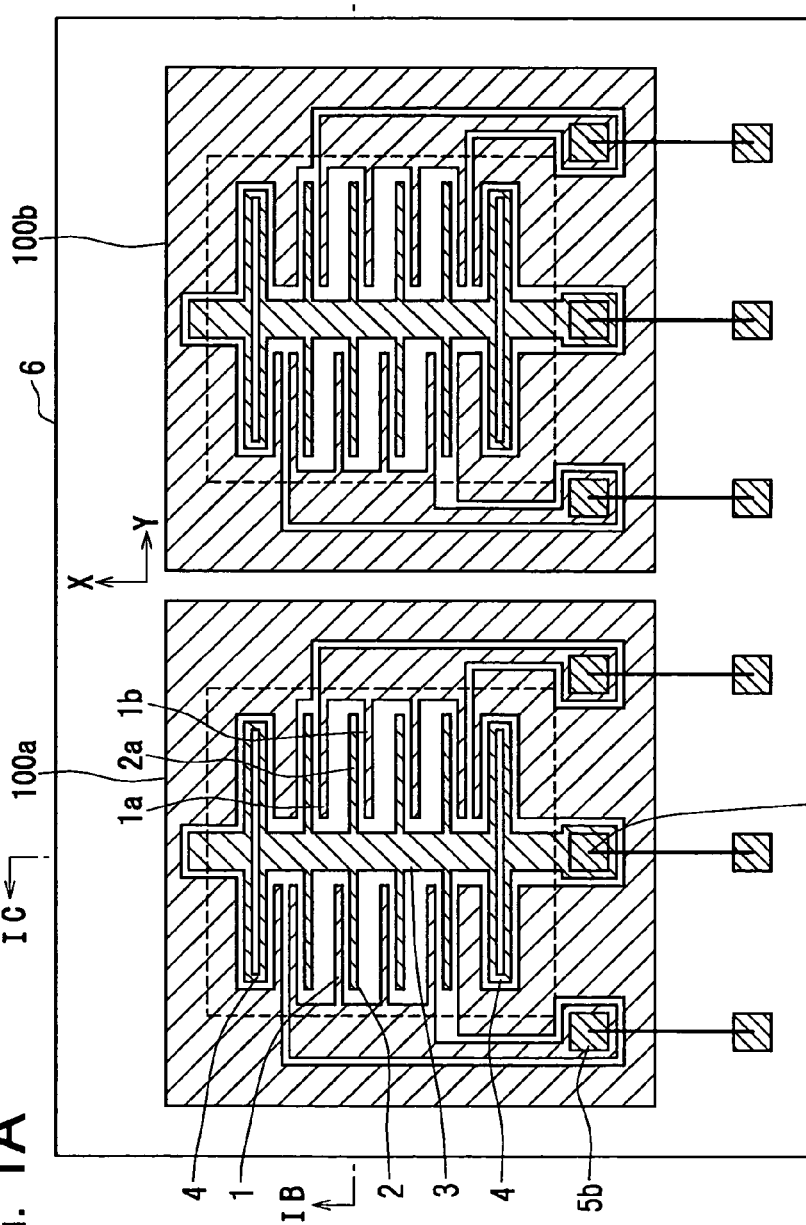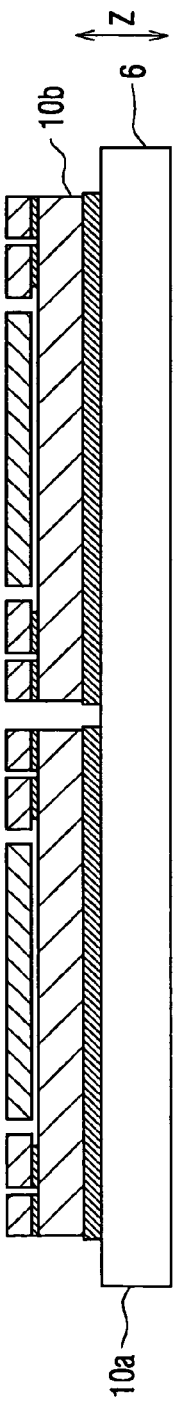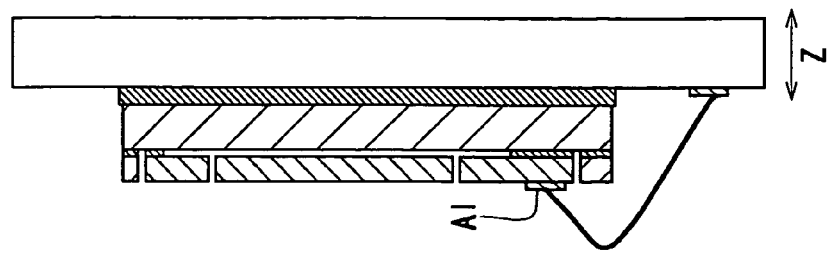

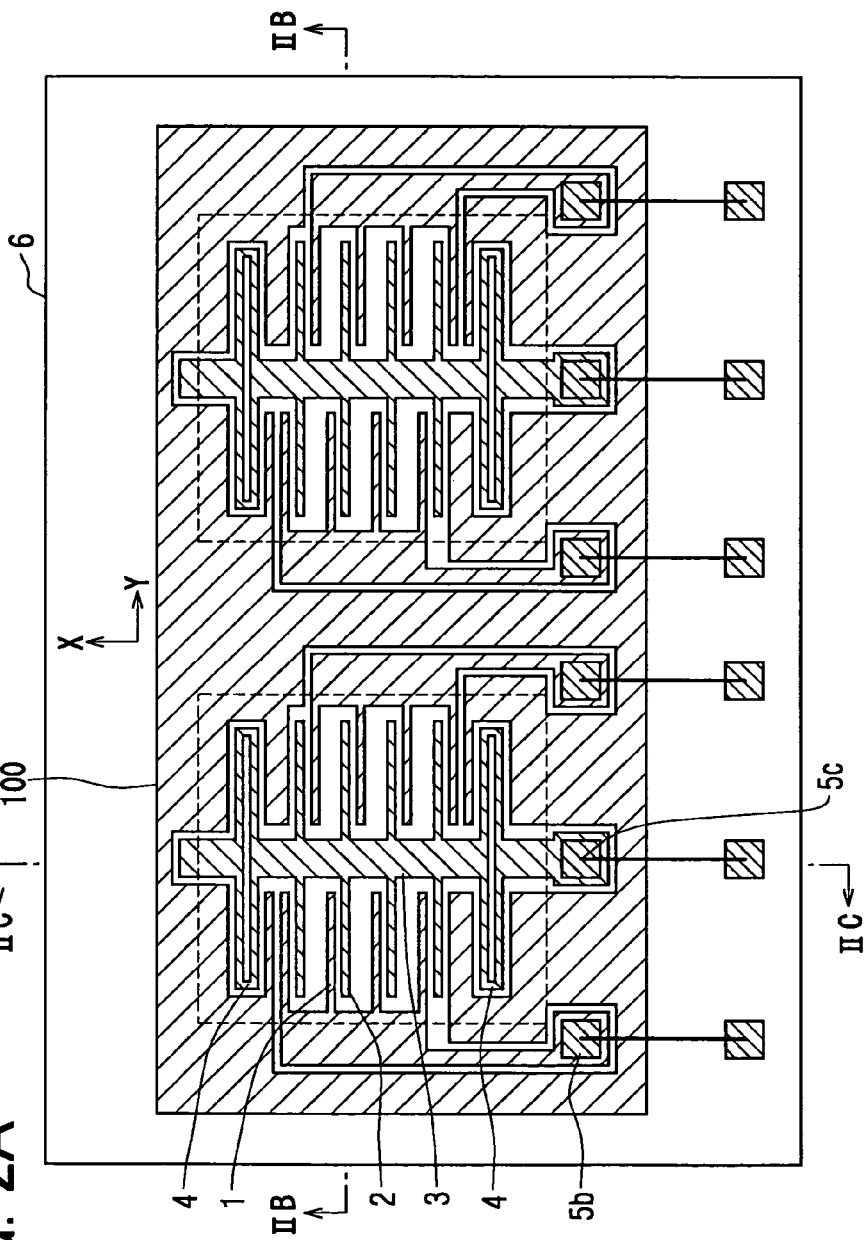
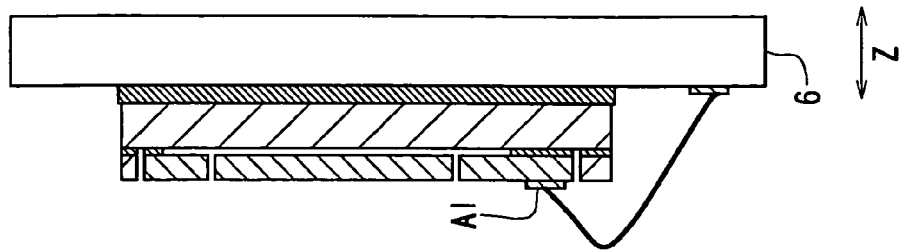
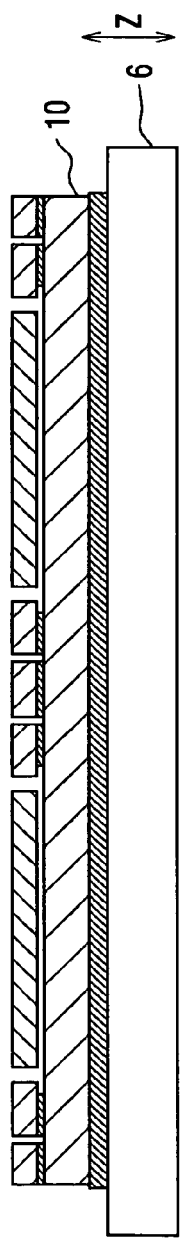

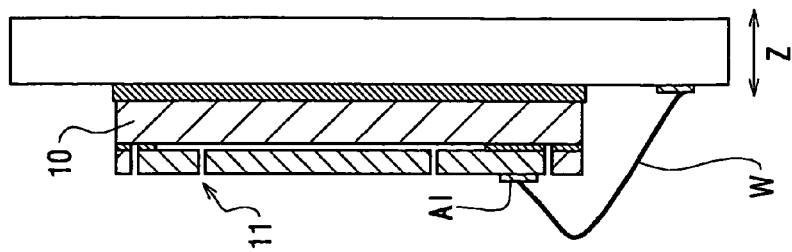
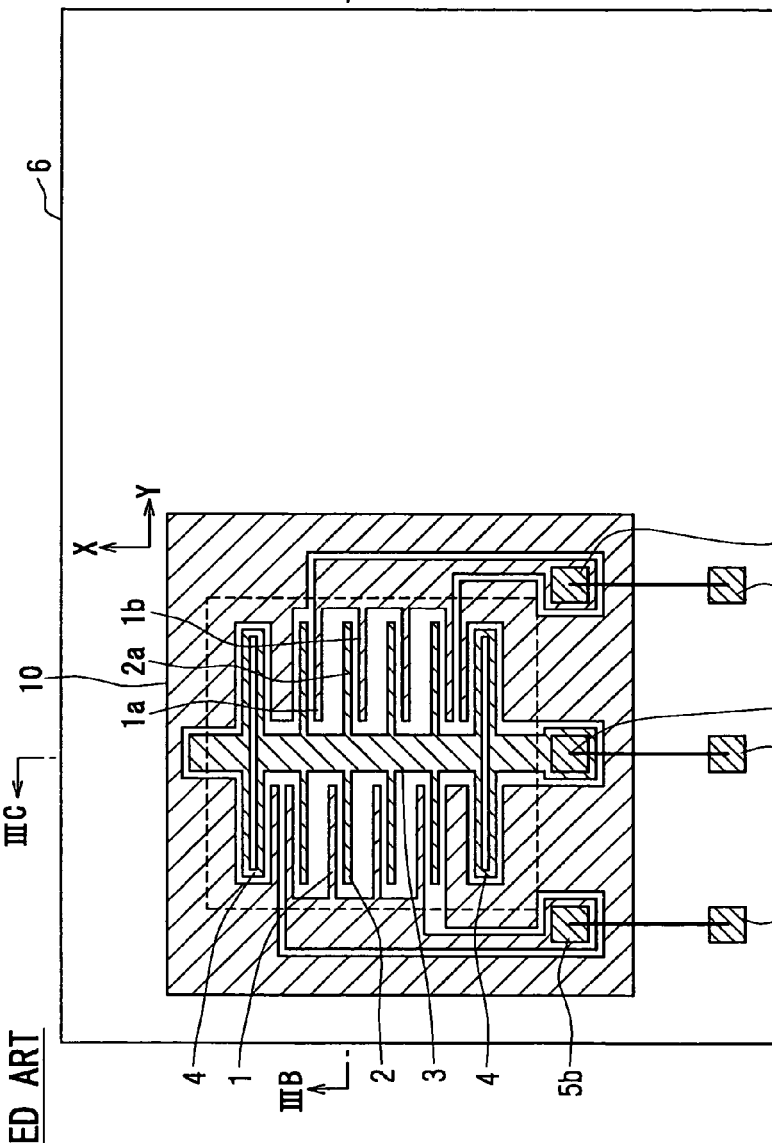
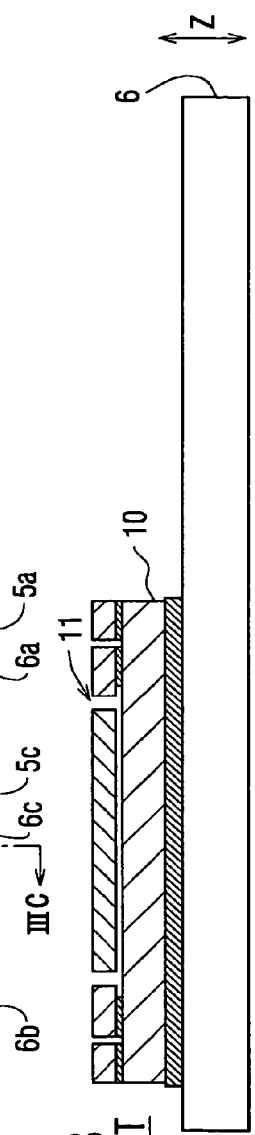

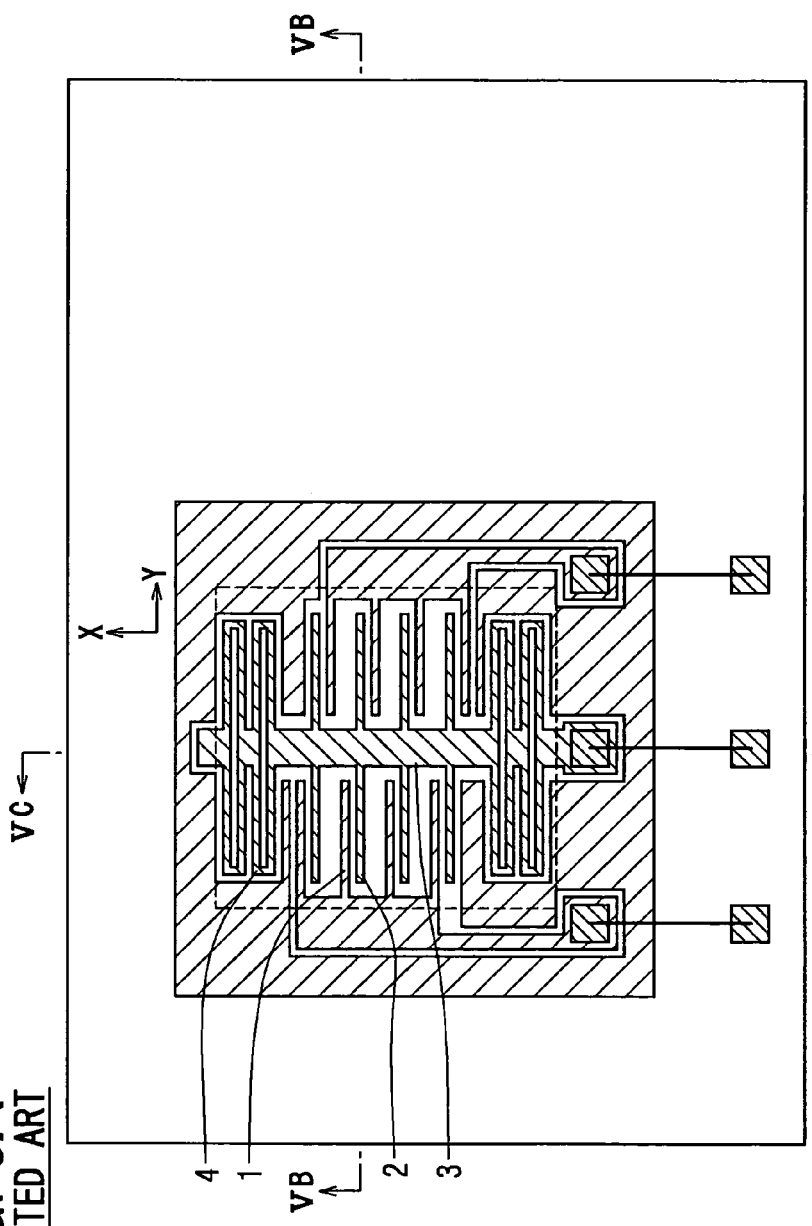
FIG. 5A RELATED ART
FIG. 5B RELATED ART
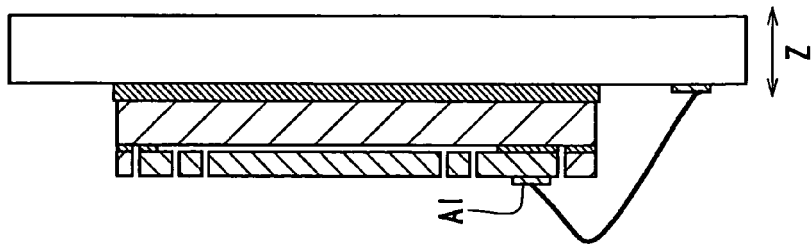
FIG. 5C RELATED ART

SEMICONDUCTOR MECHANICAL QUANTITY SENSOR

CROSS REFERENCE TO RELATED APPLICATIONS

This application is based upon, claims the benefit of priority of, and incorporates by reference the contents of Japanese Patent Application No. 2003-65836 filed on Mar. 12, 2003.

FIELD OF THE INVENTION

This invention relates to a semiconductor mechanical quantity sensor for detecting the mechanical quantity such as acceleration based on the capacities among fixed electrodes and moving electrodes.

BACKGROUND OF THE INVENTION

A semiconductor mechanical quantity sensor has been disclosed in, for example, JP-A-5-304303. A mono-axial (X-direction) capacitor-type acceleration sensor will be generally described with reference to FIGS. 3A–3C. Grooves 11 are formed in a semiconductor layer of a semiconductor substrate 10 such as of silicon, whereby a plurality of pairs of fixed electrodes 1 and moving electrodes 2 are opposed to each other in the X-direction to constitute capacitors. The moving electrodes 2 are formed in a plurality of pairs like a comb teeth in the ±Y-direction with respect to a weight 3 extending in the X-direction. Both ends of the weight 3 are formed on the semiconductor substrate 10 so as to undergo a displacement in the X-direction, and beams 4 of a two-piece structure are formed at both ends of the weight 3 so as to undergo the displacement depending upon the acceleration. The fixed electrodes 1 arranged in the ±Y-direction so as to be opposed to the moving electrodes are connected to pads 5a and 5b made of aluminum or the like, and the moving electrodes 2 are connected to a pad 5c. The pads 5a, 5b and 5c are connected to an external unit through pads 6a, 6b and 6c of another circuit chip 6 such as a mother board by bonding using wires W.

Here, a moving electrode 2a is arranged between the neighboring fixed electrodes 1a and 1b. When an acceleration in the X-direction is exerted on the sensor of this constitution, the beams 4 are displaced in the X-direction, whereby distances vary among the fixed electrodes 1a, 1b and the moving electrode 2a, causing a change in the capacitance CS1 between the fixed electrode 1a and the moving electrode 2a and in the capacitance CS2 between the fixed electrode 1b and the moving electrode 2a. An equivalent circuit of the semiconductor mechanical quantity sensor is illustrated on the left side in FIG. 4. A pulse voltage Vcc has been applied across the fixed electrodes 1a and 1b. A change ΔC (=CS1-CS2) in the capacitances CS1 and CS2 that has occurred is taken out from the moving electrode 2, and is converted into a voltage=(CS1−S2)·Vcc/Cf through, for example, a switched capacitor circuit 5 illustrated on the right side in FIG. 4 to thereby detect the acceleration.

In order to improve the sensitivity of the sensor, so far, it was attempted to soften the spring constant kw by varying the sizes of beams 4, electrodes 1, 2, and weight 3 of the comb teeth structure, by increasing the mass m or by increasing the capacitance C0. FIGS. 5A–5C illustrate a structure in which the beams 4 are folded twice to soften the spring constant of the beams 4 to be one-half in an attempt to double the sensitivity.

However, the resilient restoring force <electrostatic force between the fixed electrodes 1 and the moving electrodes 2 involves a problem of easy sticking. Further, the circuit chip, too, easily undergoes the displacement in the vertical direction (Z-direction). When a large shock is exerted in the Z-direction, therefore, the moving electrodes 2 ride on the fixed electrodes 1 and become no longer capable of moving. Also, the dynamic range narrows.

SUMMARY OF THE INVENTION

In view of the above-mentioned problems, it is an object of this invention is to provide a semiconductor mechanical quantity capacitor which features high sensitivity free of sticking.

In order to achieve the above object according to this invention, there are arranged, in the same direction, a plurality of mono-axial sensor for detecting a mono-axial mechanical quantity based on capacitances among fixed electrodes and moving electrodes coupled to beams that are capable of undergoing displacement depending upon the acceleration.

The above constitution makes it possible to improve the sensitivity by a plurality of number of times without causing sticking.

When the output of a single sensor is doubled, the noise component, too, is doubled and the S/N ratio does not vary. According to this invention using two sensors, however, the output of signal component only is doubled while the noise component remains unchanged. Therefore, the S/N ratio is improved twice as much (noise occurs in a random fashion and is not superposed).

BRIEF DESCRIPTION OF THE DRAWINGS

The above and other objects, features and advantages of the present invention will become more apparent from the following detailed description made with reference to the accompanying drawings. In the drawings:

FIG. 1A is a plan view of a semiconductor mechanical quantity sensor according to a preferred embodiment, FIG. 1B is a sectional view along the line IB—IB of FIG. 1A, and FIG. 1C is a sectional view along the line IC—IC of FIG. 1A;

FIG. 2A is a plan view of a semiconductor mechanical quantity sensor according to a modification, FIG. 2B is a sectional view along the line IIB—IIB of FIG. 2A, and FIG. 2C is a sectional view along the line IIC—IIC of FIG. 2A;

FIG. 3A is a plan view of a related art semiconductor mechanical quantity sensor, FIG. 3B is a sectional view along the line IIIB—IIIB of FIG. 3A, and FIG. 3C is a sectional view along the line IIIC—IIIC of FIG. 3A;

FIG. 5A is a plan view of a related art semiconductor mechanical quantity sensor, FIG. 5B is a sectional view along the line VB—VB of FIG. 5A, and FIG. 5C is a sectional view along the line VC—VC of FIG. 5A;

DESCRIPTION OF THE PREFERRED EMBODIMENTS

Figure 4:
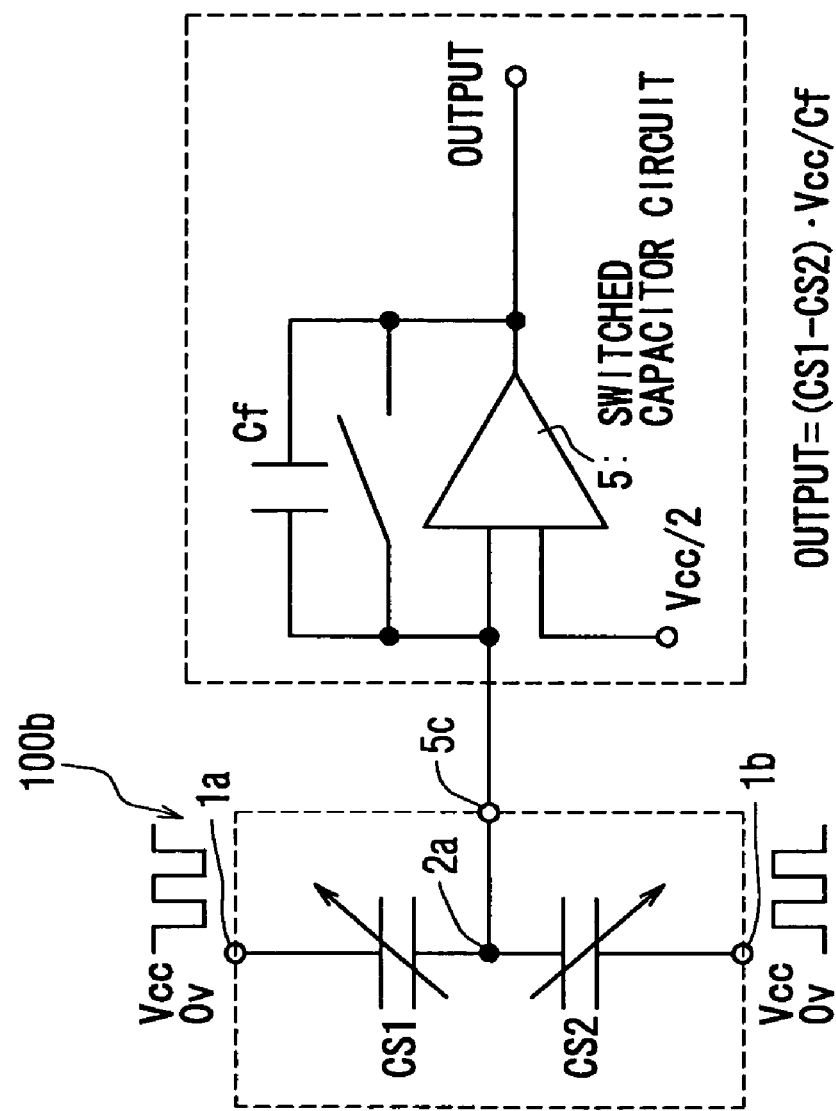
FIG. 4 is a circuit diagram illustrating an equivalent circuit of the related art semiconductor mechanical quantity sensor and a switched capacitor circuit.

An embodiment of the invention will now be described with reference to the drawings.

FIGS. 1A–1C illustrate an embodiment in which two sensor chips 100a and 100b, which have the same structure and the same characteristics, are formed in semiconductor substrates 10a and 10b and are arranged in the same direction on a circuit chip 6. The electrodes 1 and 2, weight 3 and beams 4 constituting the sensor chips 100a and 100b have conventional structures and will not be described here in detail.

Here, if the capacitance between the electrodes 1 and 2 is denoted by C0, the spring constant of the beams 4 by k, the mass by m, and the distance between the electrodes 1 and 2 by d, then the sensitivity may be defined as follows:

$$\text{Sensitivity} \propto C0 \cdot k/m$$

Further, the resilient restoring force of the beams 4 is expressed by $\propto k$, the electrostatic force between the electrodes 1 and 2 is expressed by $\propto 0.5 \cdot C0 \cdot V2/d$, the Z-direction displacement of the moving electrode 1 is expressed by $\propto (k/m)\ 0.5$, and the dynamic range is expressed by $\propto (k/m)\ 0.5$.

Figure 6:
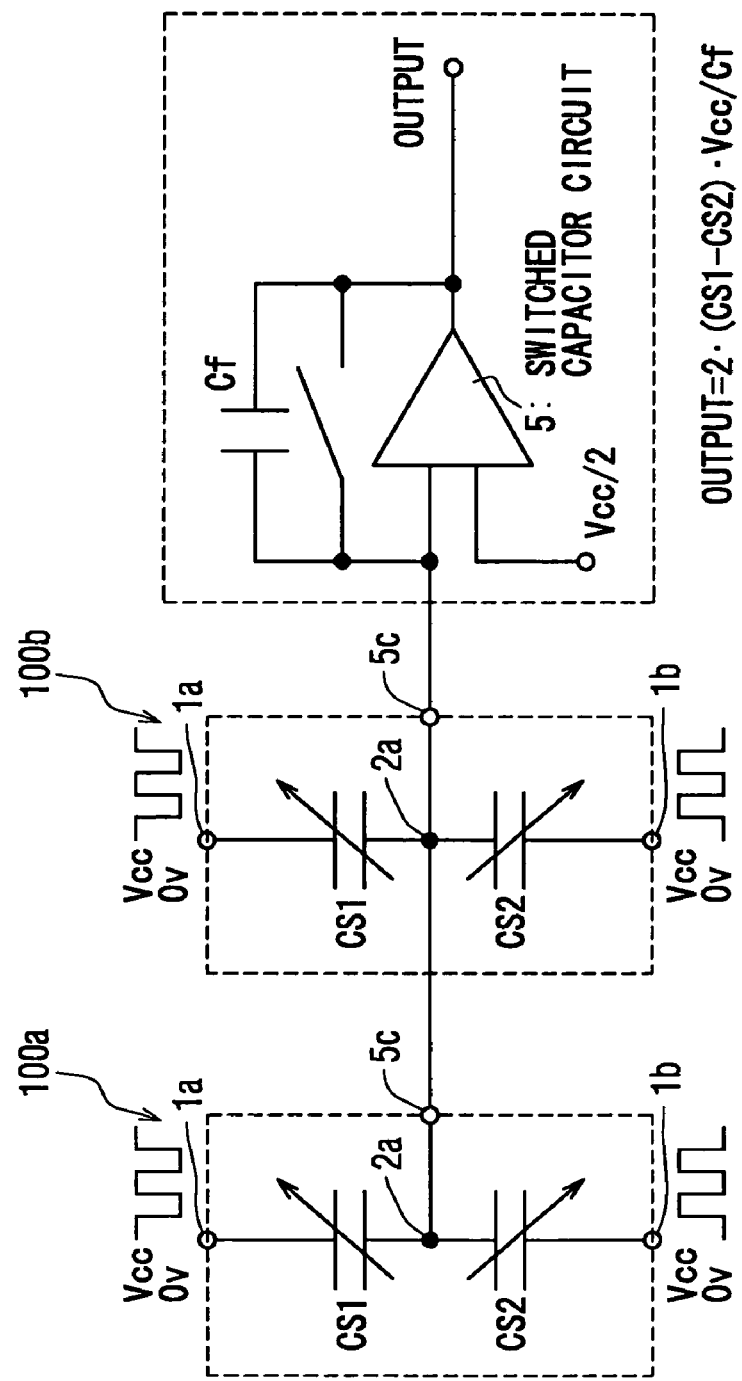
FIG. 6 is a circuit diagram illustrating an equivalent circuit of the semiconductor mechanical quantity sensor of FIG. 1A and a switched capacitor circuit.

Here, the parameters of a lower sensitive sensor chip illustrated in FIGS. 3A–3C are denoted by k1, C01, m1 and d1. FIGS. 5A–5C are also considered below in an attempt to improve the sensitivity of the sensor chip twice as much. The equivalent circuit for the sensor chip of FIGS. 1A–1C is shown, for example, in FIG. 6. If the spring constant=k1 is softened, then sensitivity is defined as follows:

$$\text{Sensitivity} \propto C01 \cdot (2 \cdot k1)/m1 = 2 \cdot \{C01 \cdot k1/m1\}$$

Therefore, the sensitivity is improved by a factor of two. In the above discussed related art, however, the resilient restoring force of the beams 4 is halved. Therefore, if its balance relative to the electrostatic force between the electrodes 1 and 2 is taken into consideration, the sticking easily occurs and the displacement of the moving electrodes 1 in the Z-direction is doubled. Accordingly, the moving electrodes 2 tend to ride on the fixed electrodes 1.

On the other hand, the sensor chips 100a and 100b of the constitution illustrated in FIG. 1 have the same characteristics as those of FIGS. 3A–3C, preventing the sticking or the riding of electrodes, and enabling the sensitivity to be improved twice as much without narrowing the dynamic range.

When the output of a single sensor is doubled, the noise component, too, is doubled and the S/N ratio does not vary. According to this embodiment using two sensors, however, the output of signal component only is doubled while the noise component remains unchanged. Therefore, the S/N ratio is improved twice as much (noise occurs in a random fashion and is not superposed).

Figure 7:
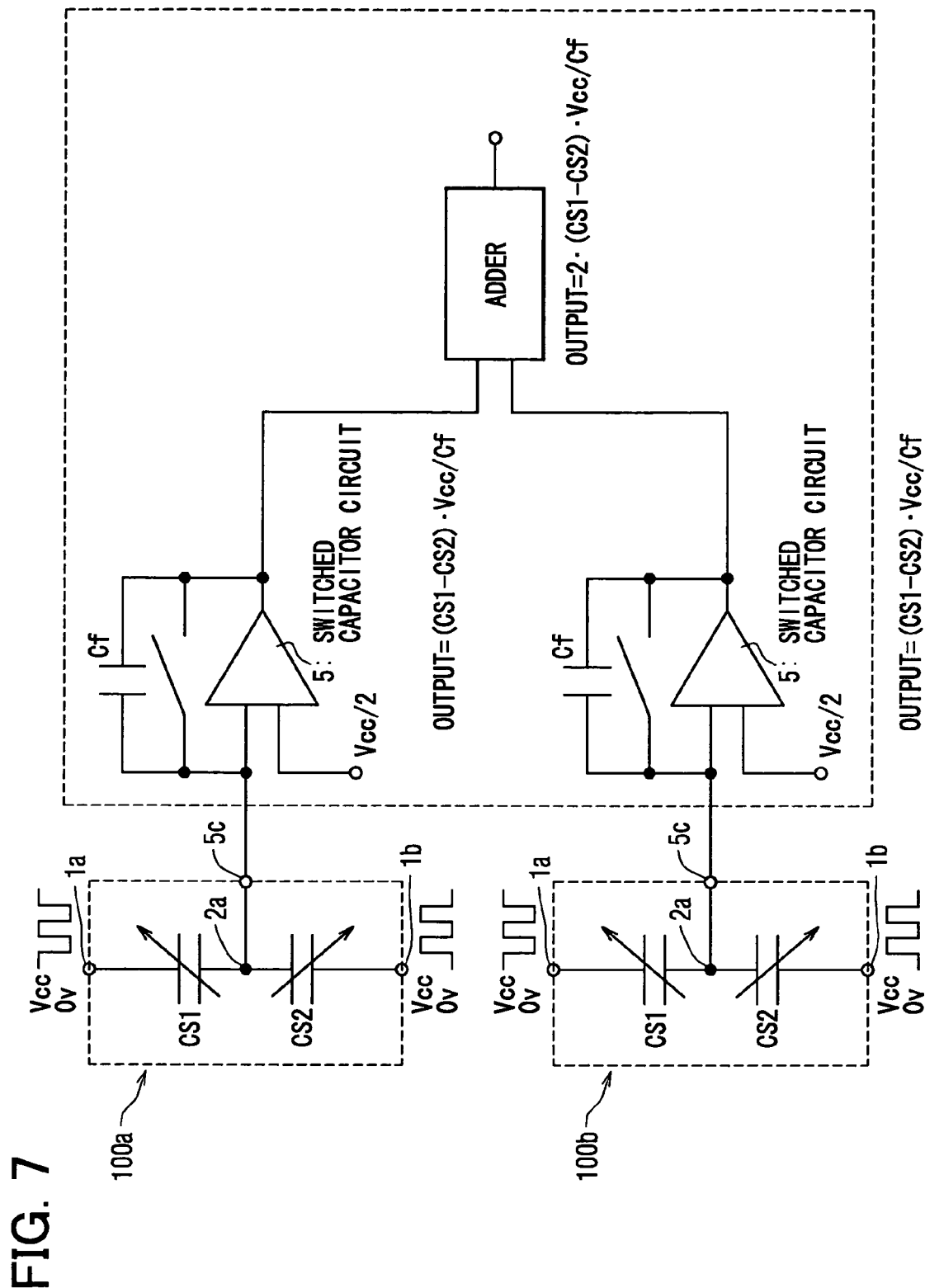
FIG. 7 is a circuit diagram illustrating an equivalent circuit of the semiconductor mechanical quantity sensor of FIG. 2A and a switched capacitor circuit.

In FIGS. 1A–1C, there were employed two sensor chips 100a and 100b having the same structure and the same characteristics formed in semiconductor substrates 10a and 10b. As illustrated in a plan view and sectional views of FIGS. 2A–2C, however, it is also allowable to use a sensor chip 100 having two sensors 100a, 100b of the same structure formed in one semiconductor substrate 10 in the same direction. The equivalent circuit for such a sensor chip 100 is shown, for example, in FIG. 7. However, the equivalent circuits of FIGS. 6 and 7 could be applied for either of the sensor chips of FIGS. 1A and 2A.

It should be noted that the number of the sensors is not limited to two and may be three or more. Further, a plurality of sensors may be stacked on the semiconductor substrate 10 or on the circuit chip 6. In this case, the sensors may be arranged on both surfaces of the semiconductor substrate 10 or the circuit chip 6.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A semiconductor mechanical quantity sensor comprising:
   a plurality of mono-axial sensors arranged in the same direction for detecting a mono-axial mechanical quantity based on capacitances among fixed electrodes and moving electrodes coupled to beams that are capable of undergoing displacement depending upon the acceleration,
   wherein each of the plurality of mono-axial sensors includes a plurality of the beams and a weight, which are independent of other mono-axial sensor,
   wherein each of the plurality of mono-axial sensors generates an output signal corresponding to the detected mono-axial mechanical quantity, and
   wherein each of the output signals are summed together to provide a detection signal having an improved signal-to-noise (S/N) ratio.

2. A semiconductor mechanical quantity sensor according to claim 1, wherein said plurality of mono-axial sensors are formed on different semiconductor substrates.

3. A semiconductor mechanical quantity sensor according to claim 1, wherein said plurality of mono-axial sensors are formed on a common semiconductor substrate.

4. A semiconductor mechanical quantity sensor according to claim 1, wherein said plurality of mono-axial sensors are formed to be stacked on a common semiconductor substrate or on a mother substrate.

5. A semiconductor mechanical quantity sensor according to claim 1, wherein said plurality of mono-axial sensors are formed on both surfaces of a common semiconductor substrate or of a mother substrate.

6. A semiconductor acceleration sensor for producing an output signal while maintaining a necessary sensitivity, comprising:
   a semiconductor substrate; and
   a plurality of sensor elements, each having fixed electrodes secured to said semiconductor substrate and moving electrodes coupled to beams, wherein the moving electrodes are capable of being displaced depending upon the acceleration, to detect acceleration based on capacitances among said fixed electrodes and said moving electrodes;
   wherein each of the plurality of sensor elements includes a plurality of the beams and a weight, which are independent of other of the plurality of sensor elements,
   wherein said sensor elements are provided in a predetermined number, each of said sensor elements has a sensitivity equal to said necessary sensitivity divided by said predetermined number, and the acceleration signals output from said sensor elements are summed to obtain an output signal maintaining said necessary sensitivity.

7. A semiconductor mechanical quantity sensor according to claim 1, wherein output lines from each of the plurality of mono-axial sensors transmitting the output signals are connected in parallel.

8. A semiconductor mechanical quantity sensor according to claim 1, wherein each of the output signals are added in parallel.

9. A semiconductor mechanical quantity sensor, comprising:
  a first mono-axial sensor element oriented in a first direction for detecting a first mechanical quantity and generating a first output signal indicating the first mechanical quantity; and
  a second mono-axial sensor element oriented in the first direction for detecting a second mechanical quantity and generating a second output signal indicating the second mechanical quantity,
  wherein the first mono-axial sensor element includes a first plurality of beams and a first weight, which are independent of the second mono-axial sensor element,
  wherein the second mono-axial sensor element includes a second plurality of beams and a second weight, which are independent of the first mono-axial sensor element,
  wherein the first and second output signals are combined to provide a detection signal.

10. A semiconductor mechanical quantity sensor according to claim 9, further comprising:
  a third mono-axial sensor element oriented in the first direction for detecting a third mechanical quantity and generating a third output signal indicating the third mechanical quantity,
  wherein the first, second, and third output signals are combined to provide the detection signal.

11. A semiconductor mechanical quantity sensor according to claim 9, further comprising:
  a plurality of mono-axial sensor element oriented in the first direction for detecting a plurality of mechanical quantities and generating a plurality of output signals indicating corresponding plurality of mechanical quantities,
  wherein the first, second, and plurality of output signals are combined to provide the detection signal.

12. A semiconductor mechanical quantity sensor according to claim 9, wherein the first and second mono-axial sensors are formed on different semiconductor substrates.

13. A semiconductor mechanical quantity sensor according to claim 9, wherein the first and second mono-axial sensors are formed on a common semiconductor substrate.

14. A semiconductor mechanical quantity sensor according to claim 9, wherein the first and second mono-axial sensors are stacked vertically on one of: a common semiconductor substrate and a mother substrate.

15. A semiconductor mechanical quantity sensor according to claim 9, wherein the first mono-axial sensor comprises:
  a plurality of first fixed electrodes extending in a second direction different from the first direction;
  a first weight that is movable in the first direction;
  a plurality of first moving electrodes extending in the second direction from the first weight, the plurality of first moving electrodes being interleaved with the plurality of first fixed electrodes in a comb-like fashion to form a plurality of first electrode pairs,
  wherein as the first weight moves in the first direction, capacitances between the plurality of first electrode pairs change.

16. A semiconductor mechanical quantity sensor according to claim 15, wherein the second mono-axial sensor comprises:
  a plurality of second fixed electrodes extending in the second direction;
  a second weight that is movable in the first direction;
  a plurality of second moving electrodes extending in the second direction from the second weight, the plurality of second moving electrodes being interleaved with the plurality of second fixed electrodes in a comb-like fashion to form a plurality of second electrode pairs,
  wherein as the second weight moves in the first direction, capacitances between the plurality of second electrode pairs change.

17. A semiconductor mechanical quantity sensor according to claim 9,
  wherein the first mechanical quantity is a first acceleration measurement of the mechanical quantity sensor in the first direction, and
  wherein the second mechanical quantity is a second acceleration measurement of the mechanical quantity sensor in the first direction.

* * * * *